United States Patent
Pribyl

(10) Patent No.: US 7,084,832 B2
(45) Date of Patent: Aug. 1, 2006

(54) PLASMA PRODUCTION DEVICE AND METHOD AND RF DRIVER CIRCUIT WITH ADJUSTABLE DUTY CYCLE

(75) Inventor: Patrick A. Pribyl, South Pasadena, CA (US)

(73) Assignee: Plasma Control Systems, LLC, South Pasadena, CA (US)

( * ) Notice: Subject to any disclaimer, the term of this patent is extended or adjusted under 35 U.S.C. 154(b) by 117 days.

(21) Appl. No.: 10/419,052

(22) Filed: Apr. 17, 2003

(65) Prior Publication Data

US 2004/0026231 A1 Feb. 12, 2004

Related U.S. Application Data

(63) Continuation-in-part of application No. 10/268,053, filed on Oct. 8, 2002.
(60) Provisional application No. 60/328,249, filed on Oct. 9, 2001.

(51) Int. Cl.
*H01Q 7/00* (2006.01)
*H03H 7/38* (2006.01)
*H05B 37/02* (2006.01)

(52) U.S. Cl. .................. 343/866; 434/742; 434/867; 333/32; 315/224; 315/111.51

(58) Field of Classification Search ............. 343/866, 343/742, 867, 741, 744; 333/32, 24 R, 99 PL; 315/224, 111.51, 111.21, 44
See application file for complete search history.

(56) References Cited

U.S. PATENT DOCUMENTS

| 3,860,507 A | 1/1975 | Vossen Jr. | 204/192 |
| 4,557,819 A | 12/1985 | Meacham et al. | 204/298 |

(Continued)

FOREIGN PATENT DOCUMENTS

| WO | WO 01/93315 A2 | 12/2001 |
| WO | WO 02/082861 A1 | 10/2002 |
| WO | PCT/US04/12277 | 10/2004 |
| WO | PCT/US04/12277 | 2/2005 |

OTHER PUBLICATIONS

Batchelor, D.B., *Overview of ORNL RF Theory*, May 9, 2000, *presented in* ornl dbb Jun. 19, 2001.

Hayden et al., *The Application of Helicon Antennas as a Secondary Plasma Source for Ionized PVD*, University of Illinois at Urbana–Champaign.

http://www.abatementsystems.com, website of LITMAS High Density Plasma Tools (printed May 12, 2002).

International Search Report of International Application No. PCT/US02/32334, mailed Feb. 26, 2003.

(Continued)

*Primary Examiner*—Tuyet T. Vo
(74) *Attorney, Agent, or Firm*—Jones Day

(57) ABSTRACT

An RF driver circuit and an orthogonal antenna assembly/configuration, are disclosed as part of a method and system for generating high density plasma. The antenna assembly is an orthogonal antenna system that may be driven by any RF generator/circuitry with suitable impedance matching to present a low impedance. The disclosed RF driver circuit uses switching type amplifier elements and presents a low output impedance. The disclosed low-output impedance RF driver circuits eliminate the need for a matching circuit for interfacing with the inherent impedance variations associated with plasmas. Also disclosed is the choice for capacitance or an inductance value to provide tuning for the RF plasma source. There is also provided a method for rapidly switching the plasma between two or more power levels at a frequencies of about tens of Hz to as high as hundreds of KHz.

17 Claims, 12 Drawing Sheets

U.S. PATENT DOCUMENTS

| | | | |
|---|---|---|---|
| 4,629,887 A | 12/1986 | Bernier | |
| 4,792,732 A | 12/1988 | O'Loughlin | |
| 4,824,546 A | 4/1989 | Ohmi | 204/298 |
| 5,108,569 A | 4/1992 | Gilboa et al. | 204/192.13 |
| 5,140,223 A | 8/1992 | Gesche et al. | 315/111.21 |
| 5,147,493 A | 9/1992 | Nishimura et al. | 156/345 |
| 5,273,610 A | 12/1993 | Thomas, III et al. | |
| 5,288,971 A | 2/1994 | Knipp | 219/121.21 |
| 5,429,070 A | 7/1995 | Campbell et al. | |
| 5,473,291 A | 12/1995 | Brounley | 333/17.3 |
| 5,478,429 A | 12/1995 | Komino et al. | 156/345 |
| 5,541,482 A | 7/1996 | Siao | |
| 5,558,718 A | 9/1996 | Leung | |
| 5,580,385 A | 12/1996 | Paranjpe et al. | |
| 5,602,865 A | 2/1997 | Laakmann | |
| 5,609,690 A | 3/1997 | Watanabe et al. | |
| 5,643,364 A | 7/1997 | Zhao et al. | 118/723 G |
| 5,654,679 A | 8/1997 | Mavretic et al. | |
| 5,688,357 A | 11/1997 | Hanawa | |
| 5,712,592 A | 1/1998 | Stimson et al. | |
| 5,734,353 A | 3/1998 | Van Voorhies | |
| 5,747,935 A | 5/1998 | Porter et al. | |
| 5,815,047 A | 9/1998 | Sorensen et al. | |
| 5,892,198 A | 4/1999 | Barnes et al. | |
| 6,007,879 A | 12/1999 | Scholl | |
| 6,150,628 A | 11/2000 | Smith et al. | 219/121.54 |
| 6,165,311 A | 12/2000 | Collins et al. | |
| 6,252,354 B1 | 6/2001 | Collins et al. | |
| 6,264,812 B1 | 7/2001 | Raaijmakers et al. | |
| 6,304,036 B1 | 10/2001 | Freeman et al. | |
| 6,305,316 B1 * | 10/2001 | DiVergilio et al. | |
| 6,326,584 B1 | 12/2001 | Jewett et al. | |
| 6,388,226 B1 | 5/2002 | Smith et al. | 219/121.57 |
| 6,392,210 B1 | 5/2002 | Jewett et al. | |
| 6,432,260 B1 | 8/2002 | Mahoney et al. | 156/345.35 |
| 6,472,822 B1 * | 10/2002 | Chen et al. | 315/111.21 |
| 6,486,431 B1 | 11/2002 | Smith et al. | 219/121.57 |
| 6,552,296 B1 | 4/2003 | Smith et al. | 219/121.3 |
| 2004/0027293 A1 * | 2/2004 | Miyake et al. | 343/701 |

OTHER PUBLICATIONS

*Long–Term Evaluation of the Litmas "Blue" Plasma Device for Point–of–Use (POU) Perfluorocompound and Hydrofluorocarbon Abatement*, by International SEMATECH.

Mode Conversion Experiment in CAT, *available at* http://www.physics.auburn.edu/~plasma/fusion/fusion_lab/cat/icrf/construction.html (printed Apr. 19, 2002).

Patil et al., *Microwave plasma deposition of diamond like carbon coatings*, PRAMANA J. Physics, vol. 55, nos. 5 & 6, Nov. & Dec. 2000, pp. 933–939.

Ritchey, *Tuner Topics*, by Advanced Energy.

Heckman et al., *The Evolution of RF Power Delivery in Plasma Processing*, Advanced Energy, pp. 1–8.

Article entitled "A 2–MHz 6–k VA Voltage–Source Inverter Using Low–Profile Mosfet Modules for Low–Temperature Plasma Generators, " published in IEEE Transactions on Power Electronics, vol. 14, No. 6 (Nov. 1999).

Article entitled "A 2–MHz, 6–k VA Voltage–Source Inverter Using Low–Profile Mosfet Modules for Low–Temperature Plasma Generators," by Hideaki Fujita, Hirofumi Akagi (Dept. of Electrical Engineering) and Shinohara (Orgin Electric Co., Ltd.), copyright 1998 IEEE.

Article entitled "A 2–MHz 2–kW Voltage–Source Inverter for Low–Temperature Plasma Generators: Implementation of Fast Switching with a Third–Order Resonant Circuit," published in IEEE Transactions on Industry Applications, vol. 35, No. 1 (Jan./Feb., 1999) by Hideaki Fujita and Hirofumi Akagi.

Article entitled *"Improving Processes Through RF Control"*, published in Semiconductor Fabtech —11th (Feb. 2000).

Litmas RPS 1501, copyright notice dated 2004.*

3kW and 5kW Half–Bridge Class–D RF Generators at 13.56MHz 89% Efficiency and Limited Frequency Agility, Direct Energy, Inc., 2002.

* cited by examiner

PLASMA PRODUCTION DEVICE AND METHOD AND RF DRIVER CIRCUIT WITH ADJUSTABLE DUTY CYCLE

REFERENCE TO RELATED APPLICATIONS

This application claims the benefit under U.S.C. §119 and is a continuation-in-part of Ser. No. 10/268,053 filed Oct. 8, 2000 and claims benefit of the U.S. Provisional Application No. 60/328,249 filed on Oct. 9, 2001, which is incorporated herein in its entirety by reference.

FIELD OF THE INVENTION

The present invention relates generally to the design and implementation of a plasma generation system. More particularly, it relates to radio frequency amplifiers, antennas and effective circuit connections for interfacing the amplifiers and antennas for generating plasma.

BACKGROUND OF THE INVENTION

Plasma is generally considered to be a fourth state of matter, the others being solid, liquid and gas states. In the plasma state the elementary constituents of a substance are substantially in an ionized form rendering them useful for many applications due to, inter alia, their enhanced reactivity, energy, and suitability for the formation of directed beams.

Plasma generators are routinely used in the manufacture of electronic components, integrated circuits, and medical equipment, and in the operation of a variety of goods and machines. For example, plasma is extensively used to deposit layers of a desired substance, for instance following a chemical reaction or sputtering from a source, to etch material with high precision, and to sterilize objects by the free radicals in the plasma or induced by the plasma or to modify surface properties of materials.

Plasma generators based on radio frequency ("RF") power supplies are often used in experimental and industrial settings since they provide a ready plasma source, and are often portable and easy to relocate. Such plasma is generated by coupling the RF radiation to a gas, typically at reduced pressure (and density), causing the gas to ionize. In any RF plasma production system, the plasma represents a variable load at the antenna terminals as the process conditions changes. Among other process control factors, changes in working gas and pressure affect the amount of loading seen at the antenna terminals. In addition, the amplitude of the RF drive waveform itself affects the plasma temperature and density, which in turn also affects the antenna loading. Thus the antenna/plasma combination represents a non-constant and nonlinear load for the RF power source to drive.

A typical RF source has a 50 ohm output impedance, and requires a load that presents a matching 50 ohm impedance in order for the RF source to couple to the load most efficiently. Because of the often unpredictable changes in the plasma self inductance, effective resistance, and mutual inductance to the antenna, provision for impedance matching is made by retuning some circuit elements and possibly the plasma to obtain satisfactory energy transfer from the RF source to the generated plasma. To achieve this, an adjustable impedance matching network, or "matching box" is typically used to compensate for the variation in load impedance due to changes in plasma conditions. The matching box typically contains two independent tunable components, one that adjusts the series impedance and the other that adjusts the shunt impedance. These components must be adjusted in tandem with each other in order to achieve the optimum power transfer to the plasma. Not surprisingly, accurate tuning of these components is often a difficult process. Typically, retuning requires manual/mechanical operations/actuators to adjust one or more component values and generally sophisticated feedback circuitry for the rather limited degree of automation possible.

It is well known that the application of a sufficiently large electric field to a gas separates electrons from the positively charged nuclei within the gas atoms, thus ionizing the gas and forming the electrically conductive fluid-like substance known as plasma. Coupling radio frequency electric and magnetic fields to the gas generates, via an antenna, induces currents within this ionized gas. This, in turn, causes the gas to further ionize, and thereby increasing its electrical conductivity, which then increases the efficiency with which the antenna fields couple to the charged particles within the gas. This leads to an increase in the induced currents, resulting in the electrical breakdown and substantial ionization of the gas by various mechanisms. The effectiveness of the RF coupling is dependent upon the particular RF fields and/or waves that are used. Some types of waves that are suitable for the efficient production of large volumes of plasma are described next.

Whistler waves are right-hand-circularly-polarized electromagnetic waves (sometimes referred to as R-waves) that can propagate in an infinite plasma that is immersed in a static magnetic field $B_o$. If these waves are generated in a finite plasma, such as a cylinder, the existence of boundary conditions—i.e. the fact that the system is not infinite—cause a left-hand-circularly-polarized mode (L-wave) to exist simultaneously, together with an electrostatic contribution to the total wave field. These "bounded Whistler" are known as Helicon waves. See Boswell, R. W., *Plasma Phys.* 26, 1147 (1981). Their interesting and useful qualities include: (1) production and sustenance of a relatively high-density plasma with an efficiency greater than that of other RF plasma production techniques, (2) plasma densities of up to $N_p \sim 10^{14}$ particles per cubic centimeter in relatively small devices with only a few kW of RF input power, (3) stable and relatively quiescent plasmas in most cases, (4) high degree of plasma uniformity, and (5) plasma production over a wide pressure range, from a fraction of a mTorr to many tens of mTorr. Significant plasma enhancement associated with helicon mode excitation is observed at relatively low $B_o$-fields, which are easily and economically produced using inexpensive components.

Significant plasma density ($N_p$) enhancement and uniformity may be achieved by excitation of a low-field m=+1 helicon R-wave in a relatively compact chamber with $B_o < 150$ G. This may be achieved, for instance, through the use of an antenna whose field pattern resembles, and thus couples to, one or more helicon modes that occupy the same volume as the antenna field. The appropriate set of combined conditions include the applied magnetic field $B_o$, RF frequency ($F_{RF}$,), the density $N_p$ itself, and physical dimensions.

Some antenna designs for coupling RF power to a plasma are disclosed by U.S. Pat. Nos. 4,792,732, 6,264,812 and 6,304,036. However, these designs are relatively complex often requiring custom components that increase the cost of system acquisition and maintenance. Moreover, not all of the designs are suitable for efficient generation of the helicon mode, which is a preferred mode disclosed herein.

RF power sources typically receive an external RF signal as input or include an RF signal generating circuit. In many processing applications, this RF signal is at a frequency of 13.56 MHz, although this invention is not limited to operation at this frequency. This signal is amplified by a power output stage and then coupled via an antenna to a gas/plasma in a plasma generator for the production of plasma. Amplifiers are conventionally divided into various classes based on their performance characteristics such as efficiency, linearity, amplification, impedance, and the like, and intended applications. In power amplification, an important concern is the amount of power wasted as heat, since heat sinks must be provided to dissipate the heat and, in turn, increase the size of devices using an inefficient amplifier. A classification of interest is the output impedance presented by an amplifier since it sets inherent limitations on the power wasted by an amplifier.

Typical RF amplifiers are designed to present a standard output impedance of 50 Ohms. Since, the voltage across and current through the output terminals of such an amplifier are both non-zero, their product provides an estimate of the power dissipated by the amplifier. In contrast to such amplifiers, a switch presents two states: it is either ON, corresponding to a short circuit, i.e., low impedance, or OFF, corresponding to an open circuit, i.e., infinite (or at least a vary large) impedance. In switched mode amplifiers, the amplifier element acts as a switch under the control of the signal to be amplified. By suitably shaping the signals, for instance with a matching load network, it is possible to introduce a phase difference between the current and the voltage such that they are out of phase to minimize the power dissipation in the switch element. In other words, if the current is high, the voltage is low or even zero and vice versa. U.S. Pat. Nos. 3,919,656 and 5,187,580 disclose various voltage/current relationships for reducing or even minimizing the power dissipated in a switched mode amplifier.

U.S. Pat. No. 5,747,935 discloses switched mode RF amplifiers and matching load networks in which the impedance presented at the desired frequency is high while harmonics of the fundamental are short circuited to better stabilize the RF power source in view of plasma impedance variations. These matching networks add to the complexity for operation with a switched mode power supply rather than eliminate the dynamic matching network.

The problems faced in efficient plasma generator design include the need for a low maintenance and easily configured antenna, the elimination of expensive and limited matching networks to couple the RF power source to the non-linear dynamic impedance presented by a plasma, and the need for RF power sources that can be efficiently modulated.

SUMMARY OF THE INVENTION

It is therefore an object of the present invention to provide an improved antenna design for efficiently coupling RF sources to a plasma. It is yet another object of the present invention to provide systems for generating a plasma with the aid of an RF power source without requiring the use of a matching network to couple the RF power source to the plasma.

An illustrative plasma generator system in accordance with one embodiment of the present invention comprises at least one plasma source, the at least one plasma source having an antenna including a plurality of loops, each loop having a loop axis, the plurality of loops arranged about a common axis such that each loop axis is substantially orthogonal to the common axis; at least one radio frequency power source for driving the plurality of loops in quadrature and coupled to a plasma load driven in a circularly polarized mode, preferably a helicon mode, via the antenna; a static magnetic field substantially along the common axis; and a reactance coupling the switching amplifier to the antenna loops such that the reactance and the antenna loops without the plasma have a resonant frequency that is about equal to a specified frequency and dispensing with the requirement for a matching network. The reactance coupling the switching amplifier to the antenna loops is preferably provided at least in part by a capacitor.

The radio frequency power source preferably comprises at least one member from the group consisting of a substantially Class A amplifier, a substantially Class AB amplifier, a substantially Class B amplifier, a substantially Class C amplifier, a substantially Class D amplifier, a substantially Class E amplifier, and a substantially Class F amplifier. In one embodiment, these are connected to the primary of a transformer to reduce the drive impedance to a low value. Even more preferably the radio frequency power source includes a Class D amplifier in a push-pull configuration with a relatively low output impedance.

In a preferred embodiment, the radio frequency power source exhibits a low output impedance in comparison with the input impedance of an antenna. Often the low output impedance is significantly less than the standard impedance of 50 Ohm. The output impedance is preferably within a range selected from the set consisting of less than about 0.5 Ohms, less than about 2 Ohms, less than about 3 Ohms, less than about 5 Ohms, less than about 8 Ohms, less than about 10 Ohms, and less than about 20 Ohms. Preferably the output impedance is less than 5 Ohms, even more preferably the output impedance is between 0.5 to 2 Ohms, and most preferably the output impedance is less than 1 Ohm. Use of this low-impedance driver together with the disclosed circuit for connecting the driver to the current strap of an antenna eliminate the need for a match box, thus reducing circuit complexity and eliminating a source of failure in plasma processing systems.

A further advantage of the disclosed system is that the voltage applied to the antenna can be made quite large prior to plasma formation, thus increasing the ability to initiate the plasma in a variety of working conditions. Once the plasma is formed, the voltage reduces to a lower level to sustain the plasma, mitigating the harm resulting from possible high antenna voltages.

Depending upon the phasing between antenna elements and the value of $B_o$, the system can be run as a helicon source, or as a magnetized inductively coupled plasma (MICP) source, or as an ICP source at $B_0=0$. Furthermore, it is observed to operate efficiently and robustly in pressure regimes (e.g., with $P_o$ approximately 100 mTorr) that are very difficult to access and/or make good use of using prior art plasma sources. The currents in the antenna elements appear to abruptly "lock" into a quadrature excitation mode when the conditions on neutral pressure $P_0$, input power $P_{RF}$, and externally applied axial magnetic field $B_o$, are right. When this occurs, the plasma appears to fill the chamber approximately uniformly, which is advantageous over other sources due to the ability to produce uniform processing conditions.

Additionally, the combination of antenna system plus RF generator can create and maintain a plasma under conditions where the plasma parameters vary over much larger ranges than have been reported for other sources (e.g. neutral pressure Po varied from 100 mTorr down to 5 mTorr, and then back up again to 100+ mTorr, in a cycle lasting approximately one minute), without the need for the adjustment of any matching network components.

Another advantage of the disclosed system is that the elimination of the matching network can result in an "instant-on" type of operation for the plasma source. This characteristic can be used to provide an additional control for the process being used. In particular, it is possible to modulate the amplitude of the RF power that is generating the plasma, between two (or more) levels such as 30% and 100%, or in a fully on-off manner (0% to 100%). This modulation can occur rapidly, e.g. at a frequency of several kilohertz, and can accomplish several purposes. For instance, the average RF power can be reduced with a consequent reduction in average plasma density. The "instant-on" operation can generate plasma with an average RF input power of as little as 5 W to a volume of 50 liters.

In addition, modulation can be used to control the spatial distribution of the working gas within the reaction chamber: The distribution of the working gas is modified by the plasma, which often contributes to the non-uniformity of fluxes of the active chemicals or radicals. By modulating the duty cycle of plasma production, the flow characteristics of the neutral gas during the plasma off time (or reduced-power-level time) can be adjusted to control the uniformity of the process by way of the duty cycle. Since the plasma initiation time is usually within 10–20 microseconds of the application of the RF, the duty cycle may be controlled at frequencies as high as tens or hundreds of kHz.

In a preferred embodiment, a helicon mode RF wave is used for igniting and generating the plasma. However, other modes in addition to the illustrative helicon mode may also be used. The plasma source can, for example, operate as a type of inductively coupled plasma (ICP) device as well. In addition, variations are suitable for capacitively coupled mode (E-mode) operations.

BRIEF DESCRIPTION OF THE FIGURES

The following illustrative figures are provided to better explain the various embodiments of the invention without intending for the figures to limit the scope of the claims.

DETAILED DESCRIPTION OF THE INVENTION

Figure 1:
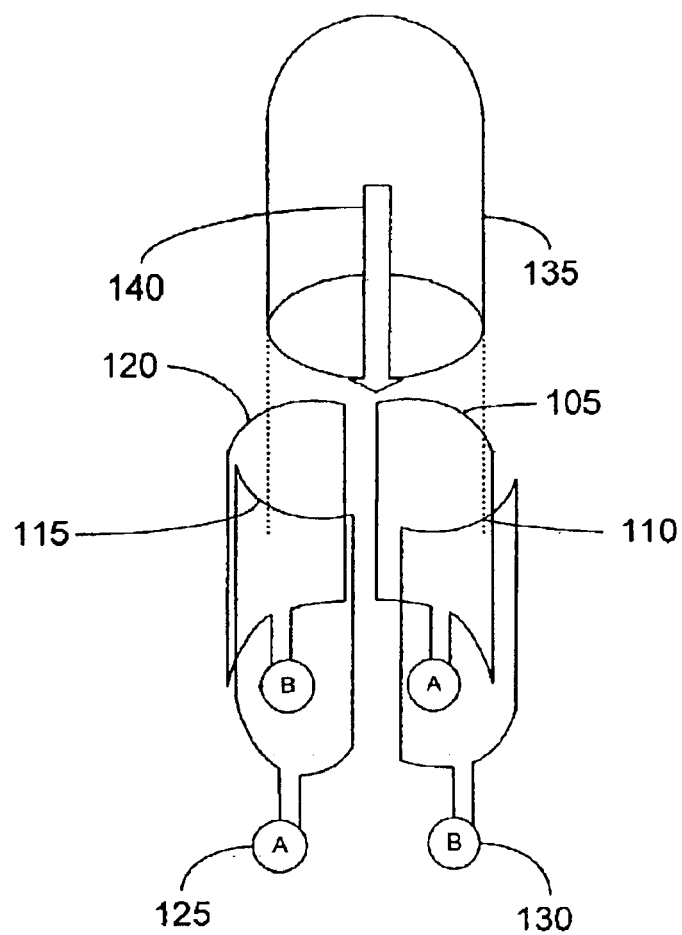
FIG. 1 illustrates a plasma source chamber with two sets of antenna elements.

Turning first to the figures, FIG. 1 illustrates a plasma source chamber with two sets of antenna elements configured in accordance with an embodiment of the present invention. The antenna design includes two orthogonal single- or multi-turn loop elements 105, 110, 115, and 120, arranged about a common axis. The antenna elements 105, 110, 115, and 120 are each driven by RF power sources, A 125 or B 130 as shown. Each antenna loop may be coupled to the same RF power source with a phase splitter, or to distinct RF power sources, to drive the antenna elements in quadrature. Preferably the loops in the antenna are constructed from eight (8) gauge teflon coated wire although copper wire or other conductors may also be used.

FIG. 1 shows two orthogonal sets of two-element Helmholtz-coil-like loop antennas, with loop elements 105 and 115 in one set and loop elements 110 and 120 in the second set. The loop elements are wrapped azimuthally around an insulating cylinder 135 such that the magnetic fields that are produced when a current is passed through them are approximately transverse to the axis of the cylinder. The opposing elements of each set are connected in series, in a Helmholtz configuration. The wires interconnecting opposing loop elements are preferably arranged such that adjacent segments carry currents flowing in opposite directions in order to enhance cancellation of stray fields associated with them, although this is not necessary to the device operation. The antennas are energized such that the currents in both orthogonal branches are nearly equal and phased 90 degrees apart to produce an approximation to a rotating transverse magnetic field.

In the example case of a helicon mode plasma, a static axial $B_o$-field 140 is produced, for instance, by a simple electromagnet. This field runs along the axis of the cylinder. The direction of this static field is such that the rotating transverse field mimics that of the m=+1 helicon wave. In practice, the amplitude and direction of the current producing the external field may be adjusted to modulate the performance of the plasma generator. The overall amplitude of the necessary field is typically in the range 10–100 Gauss for the parameters discussed here, but for different size sources alternative ranges may be employed. Once the static field optimum amplitude and direction are chosen, they typically need no further adjustment.

In combination, the static field and the RF field of the antenna elements produce the m=+1 helicon mode in the plasma inside the insulating cylinder, which sustains the plasma discharge. It should be noted that it is also possible to vary, and thus de-tune the static magnetic field, or to not apply the field at all, so that the helicon mode is not directly excited. This operation produces a plasma as well, but typically not as efficiently as the helicon mode. Of course, the static field may then be applied to improve the operation of the plasma source/generator.

It should also be noted that it is possible to achieve the same overall conditions of FIG. 1 using for instance multi-turn loop antennas instead of single loop, and/or a squat bell jar. Although not a requirement, it is preferable for the Bell jar to fit within the antenna frame with no more than a ½" gap.

One example plasma source setup is as follows: A quartz bell jar has approximately 12" inside diameter (such as a standard K. J. Lesker 12×12), consisting of a straight-cylindrical section approximately 15 cm tall with a 6" radius hemispherical top. The jar rests atop a vacuum chamber approximately 12" i.d.×8" tall (not part of the plasma source). The antennas consist of two sets of opposing, close-packed, approximately rectangular, two-turn continuous loop antenna elements that surround the bell jar, with approximately ⅛" to ½" spacing between the antennas and the bell jar at every point. The turns within each element are connected in series, and the two elements within each set are also connected in series, such that their fields are additive. The self-inductance of each set is approximately 10 micro-Henries in this example, and the mutual inductance between the two sets is less than 1 microHenry. Vertical and horizontal antenna loop sections approximately 25 cm and 20 cm long, respectively, consist of 8-guage Teflon-coated wire. In alternative embodiments single turns of rigid copper conductors may be employed in place of one or two turns of Teflon-coated wire. The particular embodiments described herein for producing a transverse rotating field are not intended to limit the scope of the invention.

Figure 2:
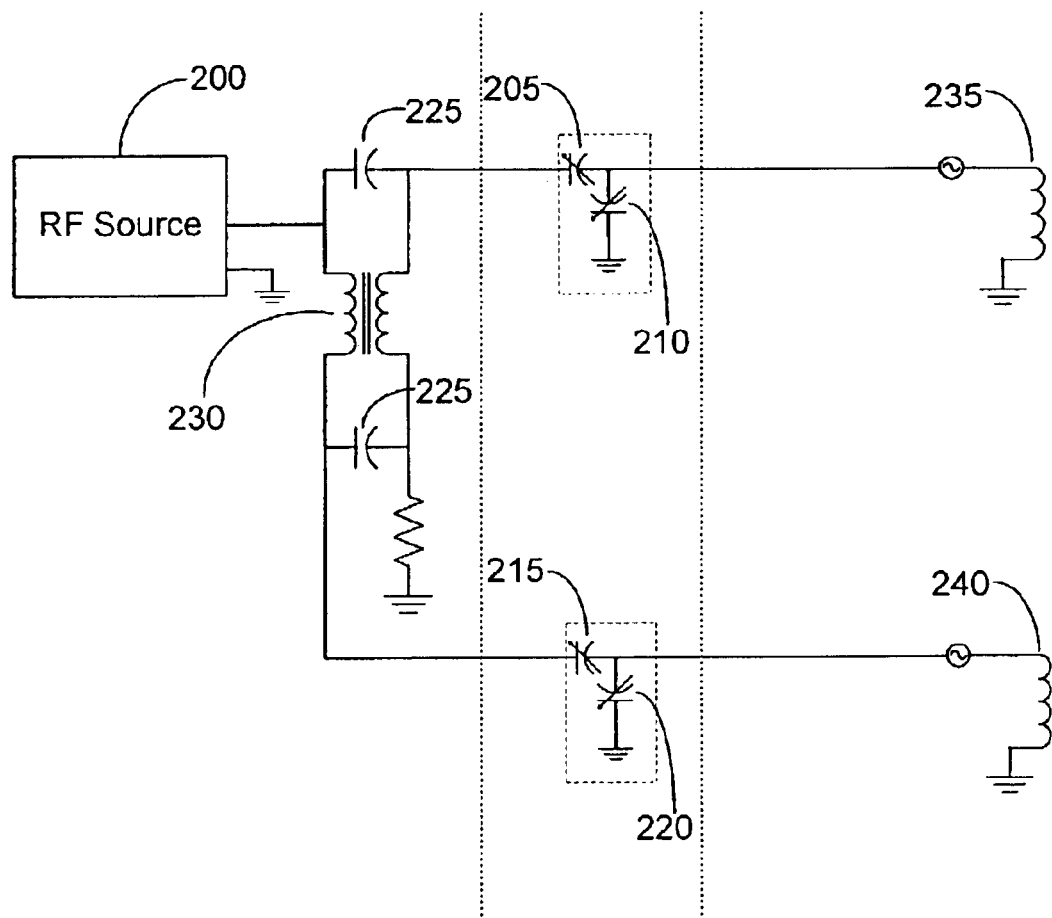
FIG. 2 illustrates a tunable circuit with an RF power source coupled to an antenna.
Figure 3:
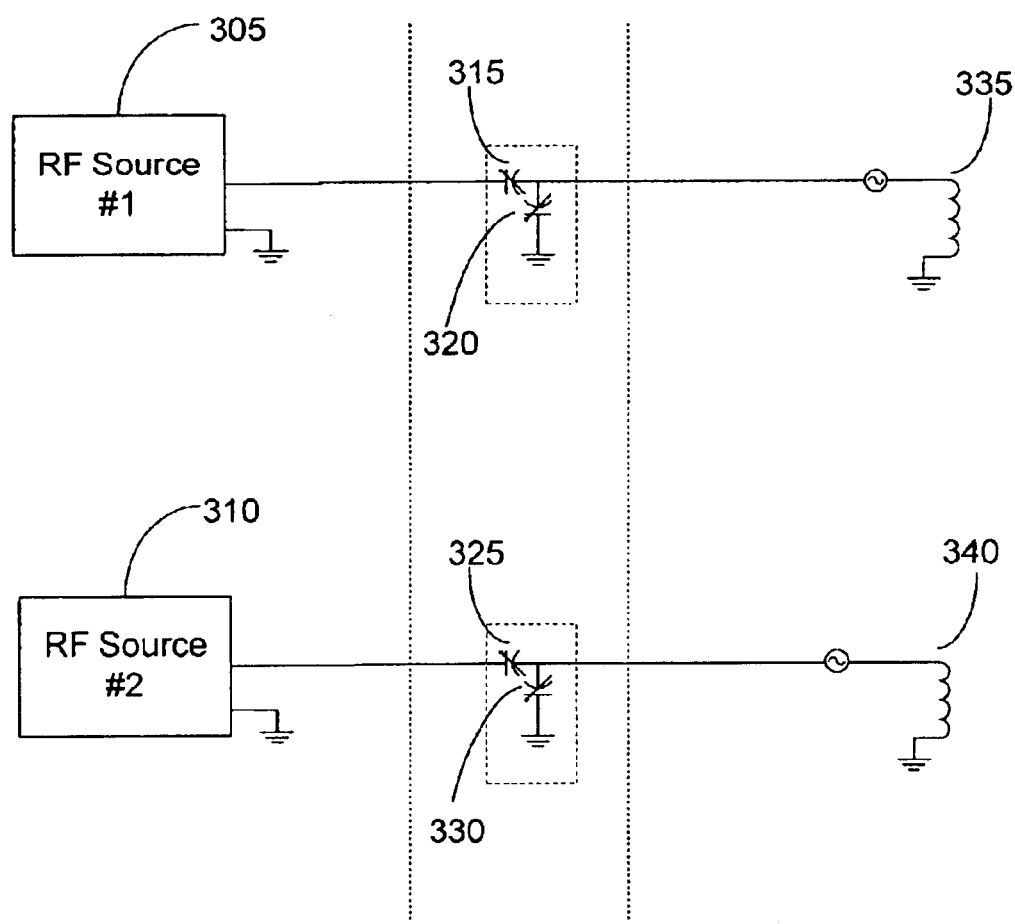
FIG. 3 illustrates a second tunable circuit with an RF power source coupled to an antenna.
Figure 4:
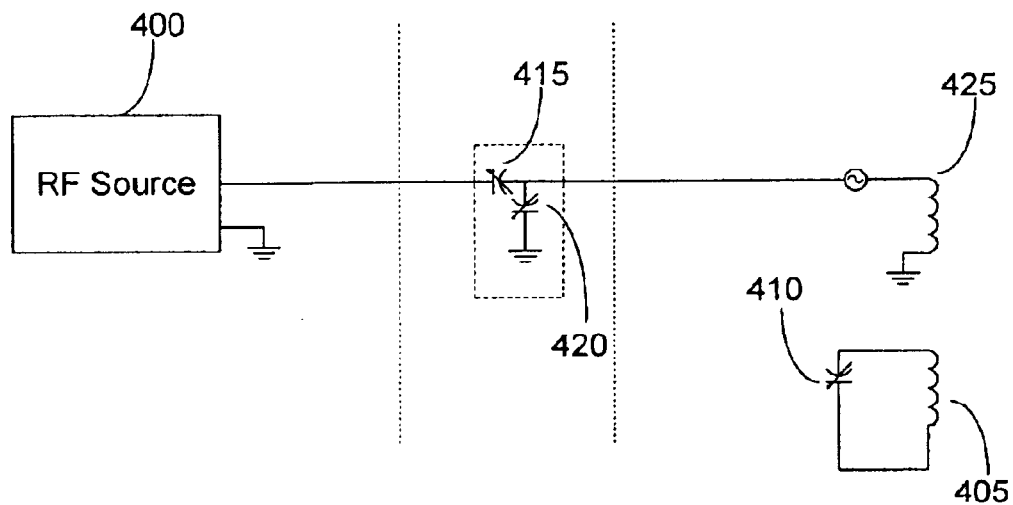
FIG. 4 illustrates a third tunable circuit with an RF power source coupled to an antenna.

A conventional RF power source and matching scheme, see FIGS. 2 to 4, may be used to excite the antenna currents in the antenna described above. Moreover, the circuits of FIGS. 2 to 4 are compatible with the methods of the present invention. These methods include steps such as providing a low output impedance to an RF power source; and adjusting a reactance coupling the RF power source to the antenna such that the resonance frequency in the absence of a plasma is the desired RF frequency. A low output impedance can be understood by reference to the quality factor ("Q") for the circuit with and without the plasma. The "Q" with no plasma present should be five to ten-fold or even higher than in the presence of the plasma. Notably, unlike known circuits, such a combination of the RF power source and antenna will not need to be readjusted in the presence of plasma by changing the reactance in response to changes in the plasma impedance.

In FIG. 2 the RF source 200 may be a commercial 2 MHz, 0–1 kW generator, connected to the quadrature/hybrid circuit at port "A" 125 illustrated in FIG. 1 via 50 ohm coax. The "+45 degree" and "−45 degree" legs of the quadrature/hybrid circuit are connected to individual L-type capacitative matching networks composed of adjustable capacitors 205, 210, 215, and 220 as shown. The reactance of capacitors 225 is about 100 ohms each at the operating frequency, and the reactance of either side of the transformer 230 is about 100 ohms with the other side open. As shown in FIG. 2, a single RF source 200 may be used, together with a passive power splitter (the quadrature/hybrid circuit) and four adjustable tuning elements 205, 210, 215, and 220 to match to the two separate antenna inductances 235 and 240.

Another embodiment, illustrated in FIG. 3, employs two separate RF power sources 305 and 310, and thus entirely separates the two antenna power circuits connected to inductances 335 and 340 via tunable capacitors 315, 320, 325, and 330 respectively. Such an arrangement is advantageous in that each RF source can be operated at full power, thus doubling the amount of input power as compared to that of a single RF source, and the phasing and amplitude ratio may be adjusted between the antennas. Typically, sources 305 and 310 are operated at roughly the same amplitude and at 90 degrees out of phase, although the amplitude and/or phase difference might be varied in order to change the nature of the excited mode. For example, by operating them at different amplitudes, an elliptically polarized plasma helicon mode rather than a strictly circularly polarized mode could be sustained.

A third embodiment, illustrated in FIG. 4, places a passive resonant circuit, comprising inductor/antenna inductance 405 and adjustable capacitor 410 on one leg, and drives the other leg with an RF source 400 with a matching circuit having tunable capacitors 415 and 420 connected to antenna inductance 425. This arrangement tends to excite the same sort of elliptical helicon mode in the plasma, with the passive side operating approximately 90 degrees out of phase with the driven side, thus providing many of the advantages of the invention but with only a single RF source and matching network.

The working gas in this example setup is Argon, with pressure ranging from 10 mTorr to over 100 mTorr. A static axial field is manually settable to 0–150 G and is produced by a coil situated outside the bell jar/antenna assembly, with a radius of about 9".

Plasma operation at a pressure of approximately 75 mTorr exhibits at least three distinct modes. First, a bright mode in which the plasma is concentrated near the edge of the bell jar is observed for $B_o<B_{critical}$ when $P_{RF}$ is less than or approximately 200 W. Here, $B_o$ is the axial magnetic field while $B_{critical}$ is a critical value for the axial field for exciting a plasma using a helicon mode. Similarly, power levels $P_{RF}$ and $P_{threshold}$ denote the RF power supplied to the antenna and a threshold power described below. In this mode, the RF antenna currents tend to not be in quadrature, instead being as much as 180 degrees out of phase. Second, a dull-glow-discharge-like mode, with uniform density/glow at higher power but with approximately 1–2 cm thick dark space along the wall of the bell jar at lower powers, is observed for $B_o>B_{critical}$ but $P_{RF}<P_{threshold}$. In this case the RF currents are in robust quadrature, appearing to abruptly lock at approximately 90 degrees phase shift shortly after the plasma is formed. Third, at higher $P_{RF}>P_{threshold}$ and with $B_o>B_{critical}$, a bright plasma is formed that appears to be more evenly radially distributed than that of mode (1), and the antenna currents again tend to lock into quadrature phasing. The third regime represents an efficient mode of operation, and can be achieved at a neutral gas pressure that has proven to be very difficult to access for known plasma sources, although each of these regimes may have application in plasma processing.

In an aspect, the present invention also enables the elimination of the conventional RF power source and tunable matching network described in FIGS. 2 to 4, in favor of a streamlined power circuit.

Figure 5:
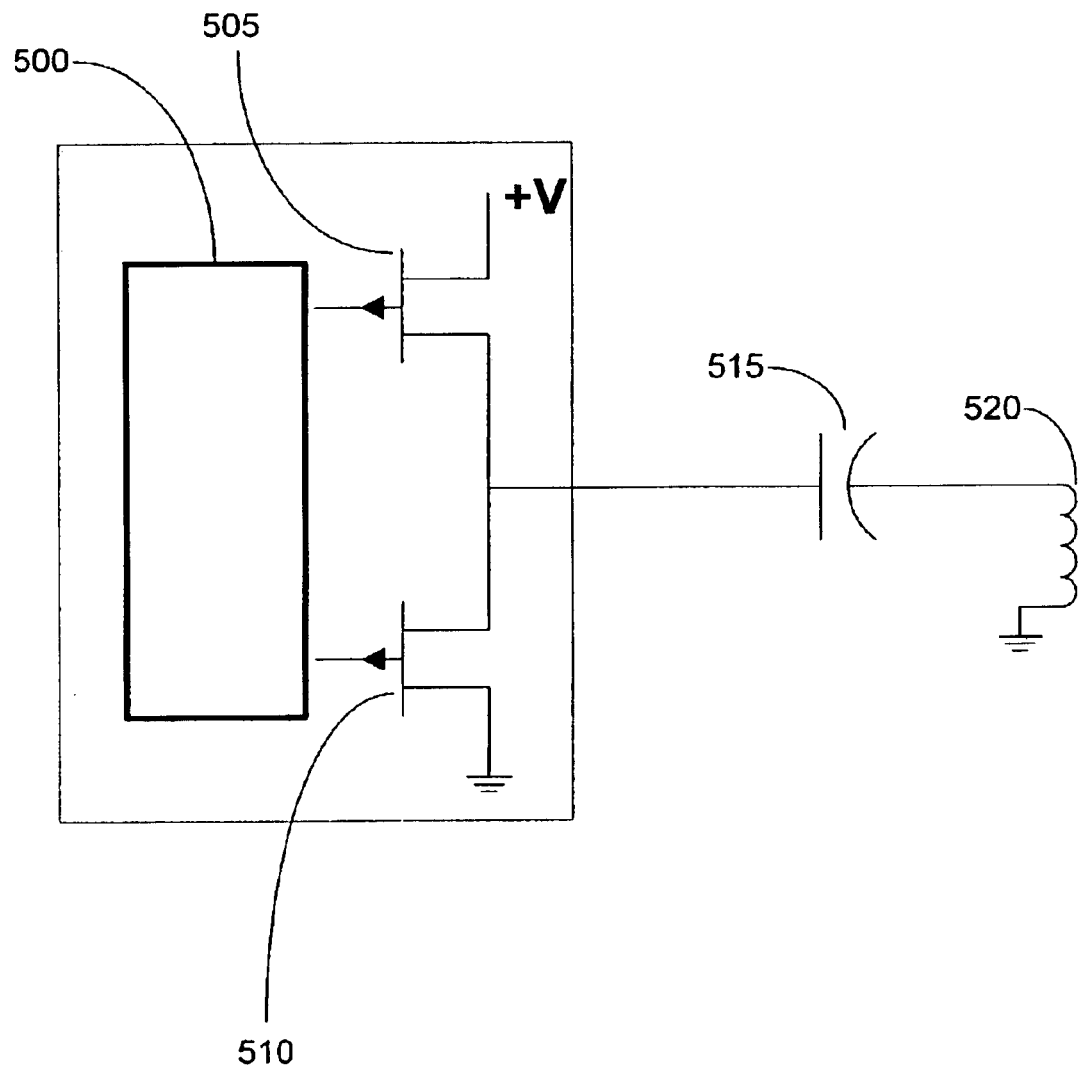
FIG. 5 illustrates a circuit with an RF power amplifier coupled to an antenna current strap.

In a preferred embodiment of the present invention, an RF power circuit drives the antenna current strap directly, using an arrangement such as that shown in FIG. 5. The RF amplifier illustrated in FIG. 5 is preferably one of the many types of RF amplifiers having a low output impedance (i.e. a push-pull output stage) that are known in the field. Transistors 505 and 510 are driven in a push-pull arrangement by appropriate circuitry 500, as is known to one of ordinary skill in the art. In this arrangement only one or the other transistor is conducting at any time, typically with a duty cycle of or less than 50%. The output of the two transistors is combined to generate the complete signal.

In a preferred embodiment, the power semiconductors, e.g., transistors 505 and 510, in the output stage are operated in switching mode. In the FIGS. 5–7 these are depicted as FETs, but they can also be, for example, bipolar transistors, IGBTs, vacuum tubes, or any other suitable amplifying device. An example of switching mode is provided by Class D operation. In this mode alternate output devices are rapidly switched on and off on opposite half-cycles of the RF waveform. Ideally since the output devices are either completely ON with zero voltage drop, or completely OFF with no current flow there should be no power dissipation. Consequently class D operation is ideally capable of 100% efficiency. However, this estimate assumes zero on-impedance switches with infinitely fast switching times. Actual implementations typically exhibit efficiencies approaching 90%.

The RF driver is then coupled directly to the antenna current strap 520 through a fixed or variable reactance 515, preferably a capacitor. This coupling reactance value is preferably such that the resonant frequency of the circuit with the coupling reactance and the antenna, with no plasma present, is approximately equal to the RF operating frequency.

An alternative arrangement of the output stage of this circuit, illustrated in FIG. 6(A), includes a transformer 620 following or incorporated into the push-pull stage, with driver 600 and transistors 605 and 610, to provide electrical isolation. Transformer 620 may optionally be configured to transform the output impedance of the push-pull stage, if too high, to a low impedance. Capacitor 615 is arranged to be in resonance at the desired drive frequency with the inductive circuit formed by transformer 620 and antenna current strap 625. A similar embodiment is shown in FIG. 6(B), where capacitor 630 is used for DC elimination, and capacitor 635 is resonant in the series circuit formed by leakage inductance of transformer 620 and inductance of the current strap 625.

Figure 6:
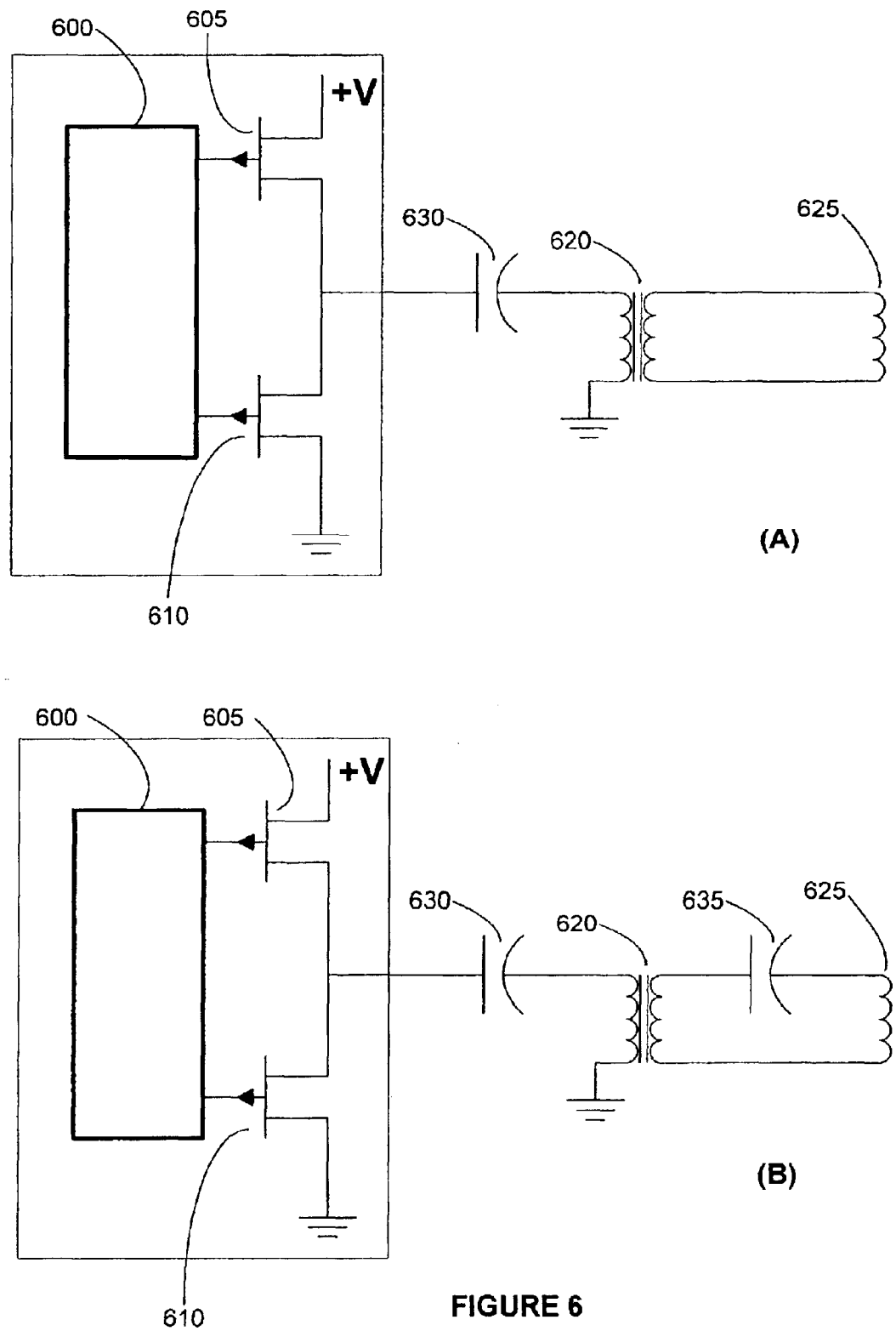
FIG. 6 illustrates a second circuit with an RF power amplifier coupled to an antenna current strap.
Figure 7:
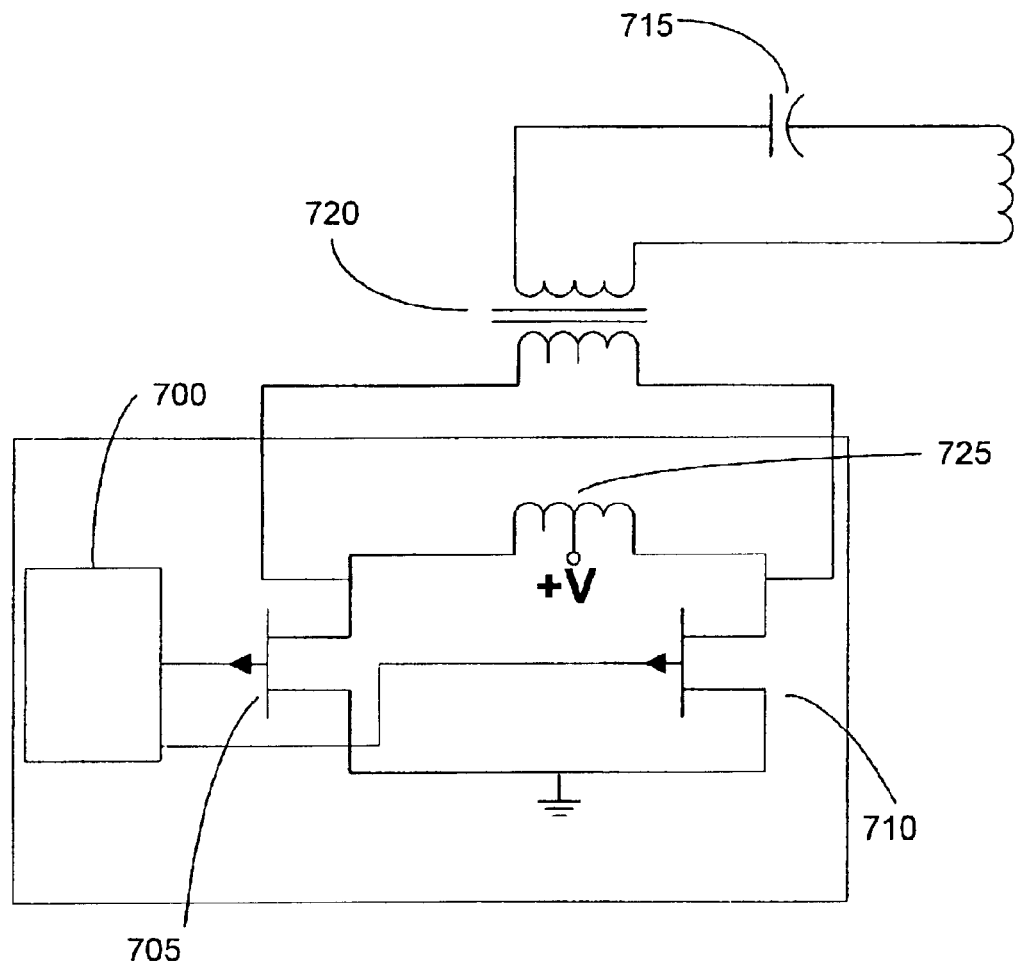
FIG. 7 illustrates a third circuit with an RF power amplifier coupled to an antenna current strap.

FIG. 7 illustrates yet another RF power and antenna current strap configuration in accordance with the present invention. A center-tapped inductor 725 incorporated in the DC power feed is connected to the output stage having push-pull driver 700 and transistors 705 and 710. Isolation is provided by transformer 720. Again, only one or the other transistor is conducting at any time, typically with a duty cycle of less than 50%. The circuits of FIGS. 5–7 are provided as illustrative examples only. Any well-known push-pull stage or other configurations providing a low output impedance may be used in their place.

The RF power source may also be used with any helicon antenna, such as either a symmetric (Nagoya Type III or variation thereof, e.g., Boswell-type paddle-shaped antenna) or asymmetric (e.g., right-hand helical, twisted-Nagoya-III antenna) antenna configuration, or any other non-helicon inductively coupled configuration.

The RF power source may be amplitude modulated with a variable duty cycle to provide times of reduced or zero plasma density interspersed with times of higher plasma density. This modulation of the plasma density can be used to affect the flow dynamics and uniformity of the working gas, and consequently the uniformity of the process. A more spatially uniform distribution comprising plasma may therefore be generated by a plasma generator system in accordance with the present invention by a suitable choice of a modulation scheme.

In general, a plasma generator system in accordance with the present invention may use radio frequency power sources based on operation as a substantially Class A amplifier, a substantially Class AB amplifier, a substantially Class B amplifier, a substantially Class C amplifier, a substantially Class D amplifier, a substantially Class E amplifier, or a substantially Class F amplifier or any sub-combination thereof. Such power sources in combination with the antennas for exciting helicon mode are suitable for generating high density plasmas. Moreover, for non-switching amplifiers, such as those shown in FIGS. 2–4, an intermediate stage to transform the RF source impedance to a low output impedance may be employed to approximate the efficient operation of the switching amplifier based embodiments described herein.

Figure 8:
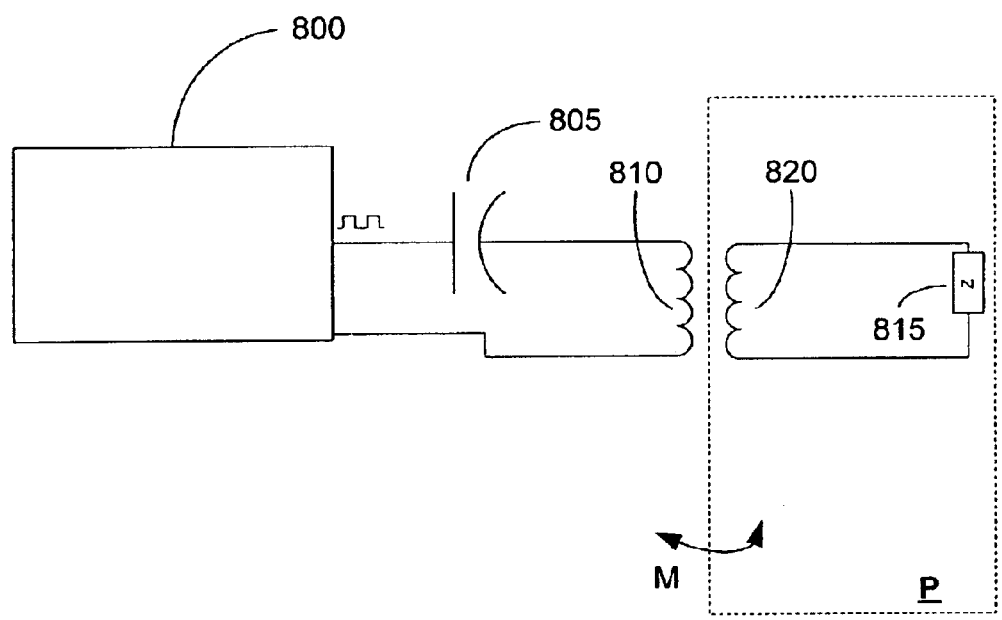
FIG. 8 illustrates a simplified model of the RF power amplifier, antenna current strap, and plasma.

In inductively coupled plasma sources, the antenna current strap is located in proximity to the region where plasma is formed, usually outside of an insulating vessel. From a circuit point of view, the antenna element forms the primary of a non-ideal transformer, with the plasma being the secondary. An equivalent circuit is shown in FIG. 8, in which inductor 810 represents a lumped-element representation of the current strap and any inductance in the wiring, including any inductance added by e.g., the driver's output transformer present in some embodiments. Components in the box labeled P represent the plasma: inductor 820 is the plasma self inductance, and impedance 815 represents the plasma dissipation, modeled as an effective resistance. M represents the mutual inductance between the antenna and plasma. Transistor driver 800 is represented as a square-wave voltage source. The capacitance 805 is adjusted at the time the system is installed to make the resonant frequency of the circuit approximately match the desired operating frequency. In an alternate embodiment with a fixed capacitor, the RF frequency may be adjusted to achieve the same effect.

Figure 9:
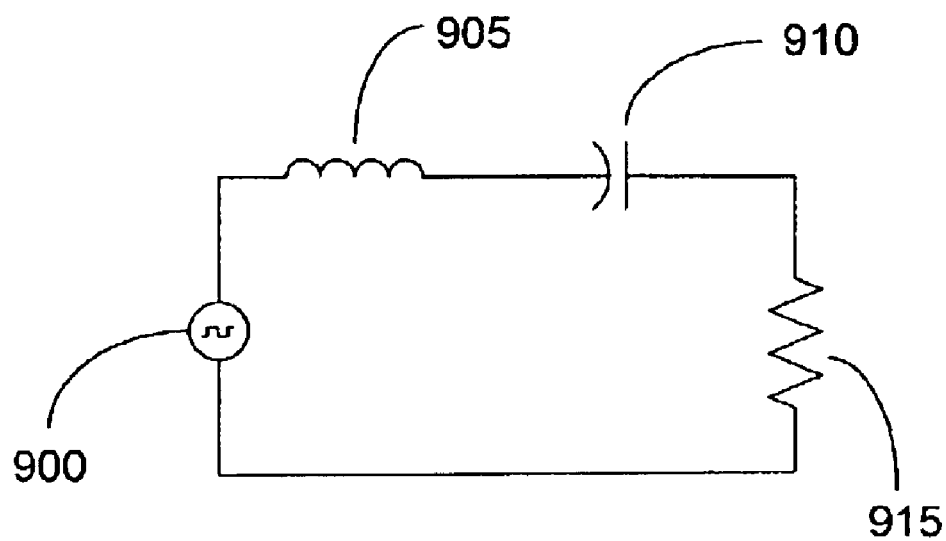
FIG. 9 illustrates a lumped circuit equivalent of the model depicted in FIG. 8.

For illustrating the operation of the system, the overall system may be modeled as shown in FIG. 9. In FIG. 9 all inductors have been lumped into inductance 905, all capacitors into capacitance 910, and all dissipating elements into resistor 915, and the amplifier should ideally operate as an RF voltage source (i.e., having zero output impedance).

Figure 10:
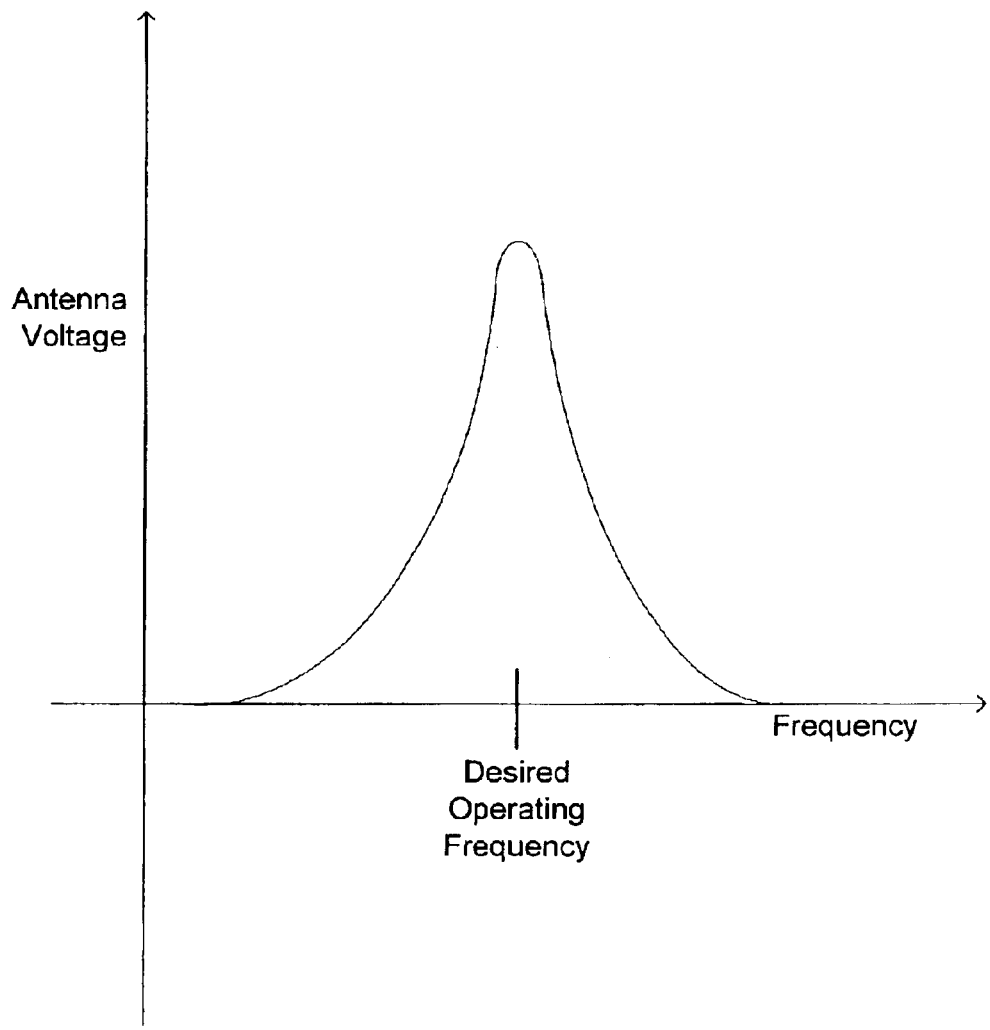
FIG. 10 illustrates the frequency response of a plasma source without a plasma.
Figure 11:
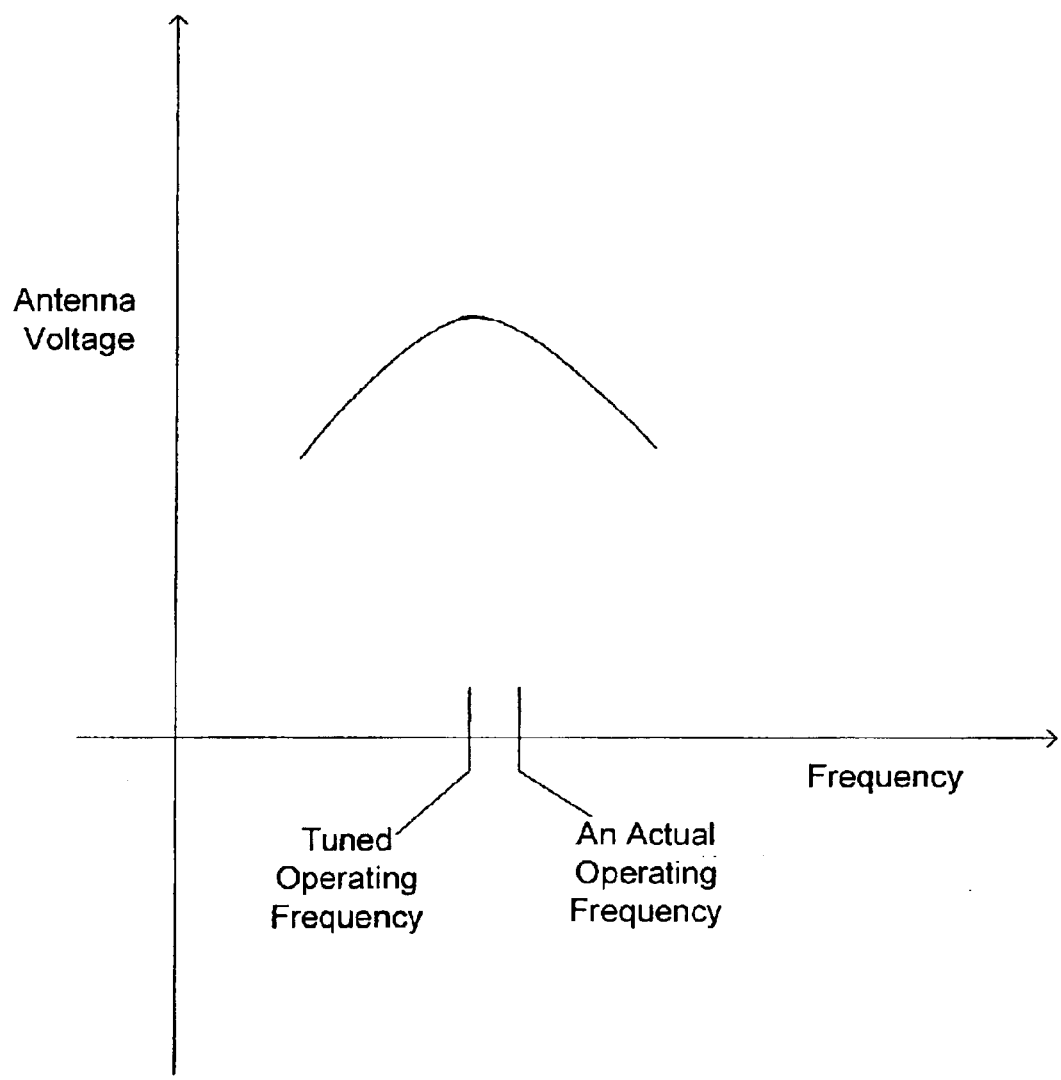
FIG. 11 illustrates the frequency response of a plasma source with a plasma present.

With no plasma present, R is small since there is little dissipation, and the circuit of FIG. 9 exhibits a narrow resonant response to changes in frequency, as shown in FIG. 10. This provides one of the advantages of the circuit's operation: it is possible to drive the voltage on the antenna to a high value with relatively little power input, thus facilitating the initial breakdown of the gas in the reaction chamber. Once the plasma forms, the damping in the system considerably broadens the resonant peak, as shown in FIG. 11, reducing the Q of the overall circuit. Although the center frequency of the resonance may shift with plasma conditions, that shift is negligible compared to the width of the resonant response when the plasma load is present. Therefore, when operating with a plasma load the circuit is relatively insensitive to variations in operating conditions, and requires no retuning. This is illustrated in FIG. 11, where the overall system resonance has shifted its frequency slightly, although the Q is sufficiently reduced that the operation of the system remains efficient. With the reduced Q of the circuit, the voltage applied to the plasma self-adjusts to be considerably reduced over the no-plasma case. In some embodiments, it may be somewhat advantageous to actually detune the operating frequency of the RF drive slightly from the exact no-plasma resonance to one side or the other, depending on the shift of the resonant frequency when the plasma forms.

Figure 12:
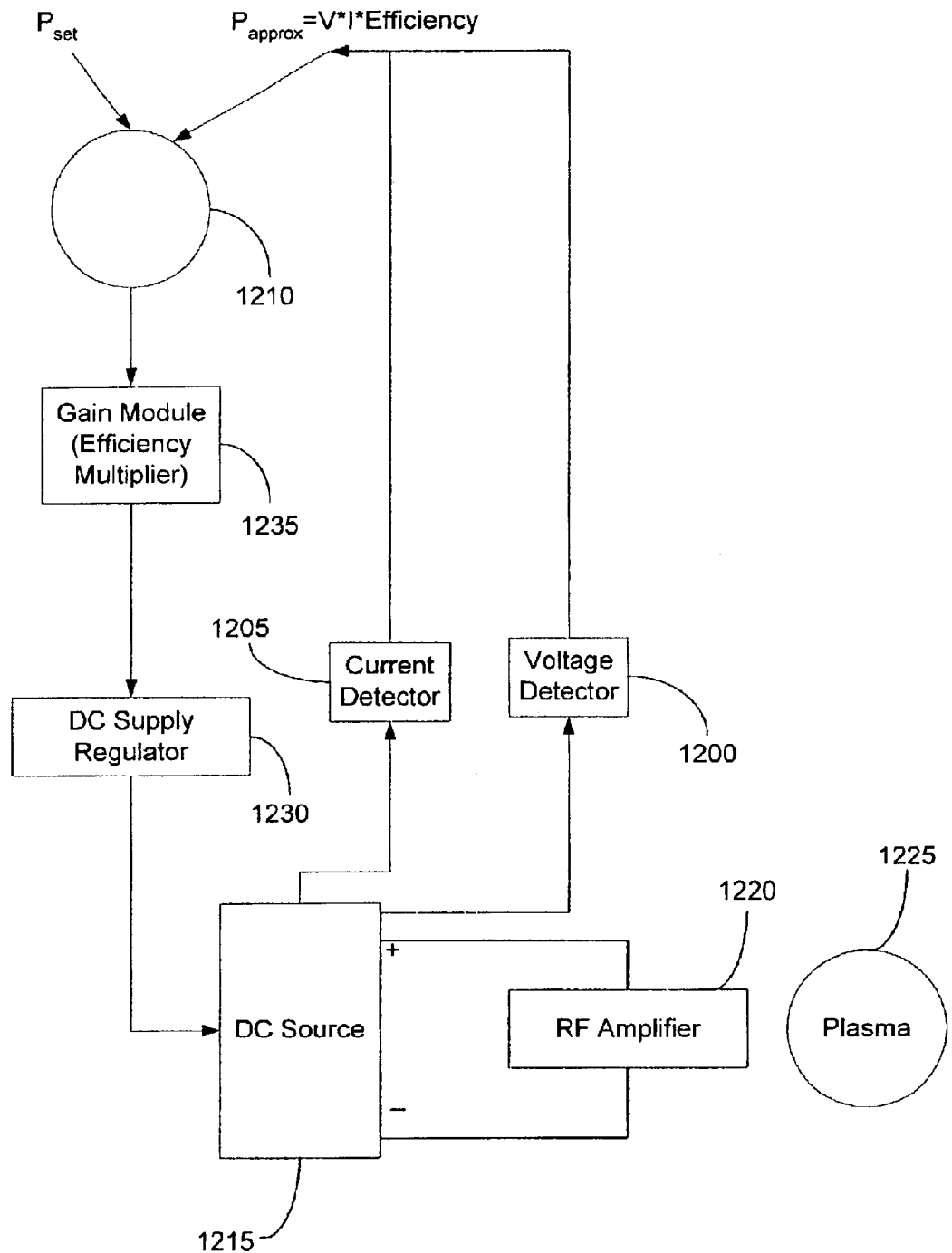
FIG. 12 illustrates a feedback arrangement for controlling a plasma source.

The level of power input to the plasma may be controlled by a variety of techniques, such as adjusting the DC supply level on the RF output stage. In one embodiment, the supply voltage may be in response to sensed variations in plasma loading to maintain a relatively constant power into the plasma source. As illustrated in FIG. 12, the sensing of plasma loading for adjustments by DC supply regulator 1230 may be achieved, for example, by monitoring the voltage from the DC supply 1215 by voltage sensor 1200 and the DC current into the RF/Plasma system by current sensor 1205, and using their product together with a previously measured approximation to the amplifier efficiency in module 1210 to estimate the net power into the plasma 1225 from RF Amplifier 1220. Efficiency multiplier for gain module 1235 can be measured for different output levels, for instance by monitoring heat loads at various points of the system, and stored digitally, so that variations in efficiency with output level are accounted for. Alternatively, the RF voltage and current can be measured, and their in-phase product evaluated to estimate the real power being dissipated in the plasma.

The sensing of plasma may also extend to sensing spatial uniformity by either direct sensing or indirect sensing by way of variations in the voltage or current. Changing the duty cycle in response to such variations can then control the spatial distribution of plasma. In addition, modulating the duty cycle can further allow control over the average input power to improve the efficiency of plasma generation. The feedback arrangement of FIG. 12 can also allow switching between two or more power levels as described previously.

"Low" impedance, as used herein, means that the series resonant circuit shown in FIG. 9 has a "Q" that should be five to ten-fold or even higher with no plasma present than with plasma present. That is, the amplifier output impedance should be sufficiently small that the energy dissipated in a half-cycle of output is much less than that stored in the reactive components. This condition is mathematically defined as $Z\_out<<sqrt(L/C)$, where L and C are the lumped values shown in FIG. 9. The RF amplifier will approach operation as a voltage source when this condition holds.

Prior to plasma initiation the reaction chamber is filled with a working gas particular to a given process. This invention provides an advantage in being able to break down this gas and initiate the plasma by virtue of the fact that the high Q of the circuit with no plasma allows high voltages to be induced on the antenna element with relatively little power in the absence of a plasma. This no-plasma voltage can be controlled to give a programmed breakdown of the working gas; once the plasma forms, induced currents in the plasma serve to load the system so that these higher voltages decay and thus, avoid stressing the system.

The described circuit arrangements, in accordance with the present invention, do not require a variable tuning element, such as a mechanically adjustable capacitor, since only fixed capacitance C is necessary. However, the various circuits can also be constructed using a variable capacitor that is adjusted, for example, for matching of the system resonance to the desired operating frequency, in a preferred embodiment, and is not needed for real-time impedance matching with the plasma operating point. Such matching is useful to counter the effects of mechanical vibration or aging that may cause the L-C resonant frequency to drift.

In one embodiment, the operating frequency is adjusted to compensate for small deviations from resonance, while mechanically tuning the capacitor compensates for large deviations. In an alternative embodiment, adjustments are made by tuning the capacitor. In the preferred (tuned) embodiment, this tuning is automated and takes place during periods when the source is offline. In another aspect, with tuning as part of the process control, for instance to provide small tweaks to the process conditions, the disclosed arrangement reduces the number of adjustable elements to as few as one in embodiments with adjustable tuning elements.

As one skilled in the art will appreciate, the disclosed invention is susceptible to many variations and alternative implementations without departing from its teachings or spirit. Such modifications are intended to be within the scope of the claims appended below. For instance, one may provide impedance matching for a low impedance with a transformer in combination with a conventional amplifier. Therefore, the claims must be read to cover such modifications and variations and their equivalents. Moreover, all references cited herein are incorporated by reference in their entirety for their disclosure and teachings.

What is claimed is:

1. A method of making a plasma source to eliminate the need for a matching circuit, the method comprising the steps of:

providing a low output impedance to a radio frequency power source;

selecting a capacitance coupling the radio frequency power source to at least one set of antenna loops such that the capacitance and the antenna loops without a plasma have a resonant frequency that is about equal to a specified frequency for the plasma; and controlling an average input power by modulating a duty cycle for operating the radio frequency power source.

2. The method of claim 1 further comprising the step of sensing a spatial distribution of the plasma, and in response thereto modulating the duty cycle to provide times of neutral gas flow, thereby modulating the spatial distribution of the plasma.

3. The method of claim 1 further comprising the step of sensing a spatial distribution of the plasma, and in response thereto modulating the duty cycle to provide times of neutral gas flow, thereby modulating the spatial distribution of a working gas.

4. The method of claim 1 further comprising the step of modulating the duty cycle to provide for neutral gas flow.

5. The method of claim 4, wherein the duty cycle is modulated at a frequency selected from at least about 1 Hz, at least about 10 Hz, at least about 100 Hz, at least about 500 Hz, at least about 1000 Hz, at least about 5000 Hz, at least about 10,000 Hz and at least about 100,000 Hz.

6. The method of claim 1, wherein a plasma power is switched between two or more levels.

7. The method of claim 6, wherein a plasma power is switched from about 30 percent to about 100 percent of full power.

8. The method of claim 1, wherein the average input power is selected from about 5 watts, about 10 watts, about 5 to 10 watts, and about 10 to 50 watts.

9. The method of claim 8, wherein the average input power is applied at an average density of about 1 watt per 10 liters of volume.

10. A method of operating a plasma source to eliminate the need for a matching circuit, the method comprising the steps of:

providing a low output impedance to a radio frequency power source;

selecting a capacitance coupling the radio frequency power source to at least one set of antenna loops such that the capacitance and the antenna loops without a plasma have a resonant frequency that is about equal to a specified frequency for the plasma; and modulating a spatial distribution of the plasma by changing a duty cycle for operating the radio frequency power source.

11. The method of claim 10, wherein the duty cycle is modulated at a frequency selected from at least about 500 Hz, at least about 1000 Hz, at least about 5000 Hz, and at least about 10,000 Hz.

12. The method of claim 10 further comprising the step of sensing a spatial distribution of the plasma, and in response thereto modulating the duty cycle.

13. The method of claim 10, wherein the duty cycle is selected to be in a range defined by two of about 10 percent, about 30 percent, about 50 percent, about 80 percent, about 90 percent, and about 100 percent.

14. The method of claim 10 further comprising the step of controlling the average input power by modulating the duty cycle.

15. The method of claim 14, wherein the average input power is selected from about 5 watts, about 10 watts, about 5 to 10 watts, and about 10 to 50 watts.

16. The method of claim 15, wherein a plasma power is switched in a relatively short time between two or more levels.

17. The method of claim 16, wherein a plasma power is switched from about 30 percent to about 100 percent of full power.

* * * * *